(12) United States Patent
Mo et al.

(10) Patent No.: US 11,075,062 B2
(45) Date of Patent: Jul. 27, 2021

(54) VACUUM PROCESSING APPARATUS

(71) Applicant: Tokyo Electron Limited, Tokyo (JP)

(72) Inventors: Yun Mo, Miyagi (JP); Yoshinobu Ohya, Miyagi (JP); Akio Miyara, Saga (JP); Keishi Kariya, Saga (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 70 days.

(21) Appl. No.: 16/683,438

(22) Filed: Nov. 14, 2019

(65) Prior Publication Data

US 2020/0161105 A1  May 21, 2020

(30) Foreign Application Priority Data

Nov. 15, 2018  (JP) .............................. JP2018-214695
Jul. 26, 2019  (JP) .............................. JP2019-137772

(51) Int. Cl.
*H01J 37/32* (2006.01)
*H01L 21/67* (2006.01)
*H01L 21/683* (2006.01)

(52) U.S. Cl.
CPC .. *H01J 37/32724* (2013.01); *H01L 21/67103* (2013.01); *H01L 21/6833* (2013.01); *H01J 2237/002* (2013.01); *H01L 21/67069* (2013.01)

(58) Field of Classification Search
CPC ........... H01L 21/67109; H01L 21/6833; H01L 21/67103; H01L 21/68757; H01L 21/6831; H01L 21/67069; H01J 37/32724; H01J 2237/002
See application file for complete search history.

(56) References Cited

FOREIGN PATENT DOCUMENTS

JP  2009-272535 A  11/2009

*Primary Examiner* — Yuechuan Yu
(74) *Attorney, Agent, or Firm* — Pearne & Gordon LLP

(57) ABSTRACT

A vacuum processing apparatus includes a heat receiving member having a heat receiving surface configured to receive heat from a heat source; and a coolant path formed within the heat receiving member along the heat receiving surface and configured to allow a coolant to flow therein. The coolant path has, at a pair of second inner wall surfaces intersecting with a first inner wall surface disposed near the heat receiving surface, a first groove extending in an inclined direction toward the first inner wall surface with respect to a flow direction of the coolant.

18 Claims, 12 Drawing Sheets

FLOW DIRECTION OF COOLANT

FLOW DIRECTION OF COOLANT

FLOW DIRECTION OF COOLANT

VACUUM PROCESSING APPARATUS

CROSS-REFERENCE TO RELATED APPLICATION

This application claims the benefit of Japanese Patent Application Nos. 2018-214695 and 2019-137772 filed on Nov. 15, 2018 and Jul. 26, 2019, respectively, the entire disclosures of which are incorporated herein by reference.

TECHNICAL FIELD

The various aspects and embodiments described herein pertain generally to a vacuum processing apparatus.

BACKGROUND

Conventionally, there is known a vacuum processing apparatus configured to perform a preset processing on a processing target object such as a semiconductor wafer (hereinafter, simply referred to as "wafer") in a vacuum environment. For example, as such a vacuum processing apparatus, there is known a plasma processing apparatus configured to perform a plasma processing such as etching on the processing target object with plasma. To control a temperature of the processing target object in this plasma processing apparatus, a coolant path is formed within a placing table along a placing surface on which the processing target object is placed. Further, there is proposed a technique of allowing a coolant in a gas-liquid two-phase state to be flown in the coolant path within the placing table.

Patent Document 1: Japanese Patent Laid-open Publication No. 2009-272535

SUMMARY

In one exemplary embodiment, a vacuum processing apparatus includes a heat receiving member having a heat receiving surface configured to receive heat from a heat source; and a coolant path formed within the heat receiving member along the heat receiving surface and configured to allow a coolant to flow therein. The coolant path has, at a pair of second inner wall surfaces intersecting with a first inner wall surface disposed near the heat receiving surface, a first groove extending in an inclined direction toward the first inner wall surface with respect to a flow direction of the coolant.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
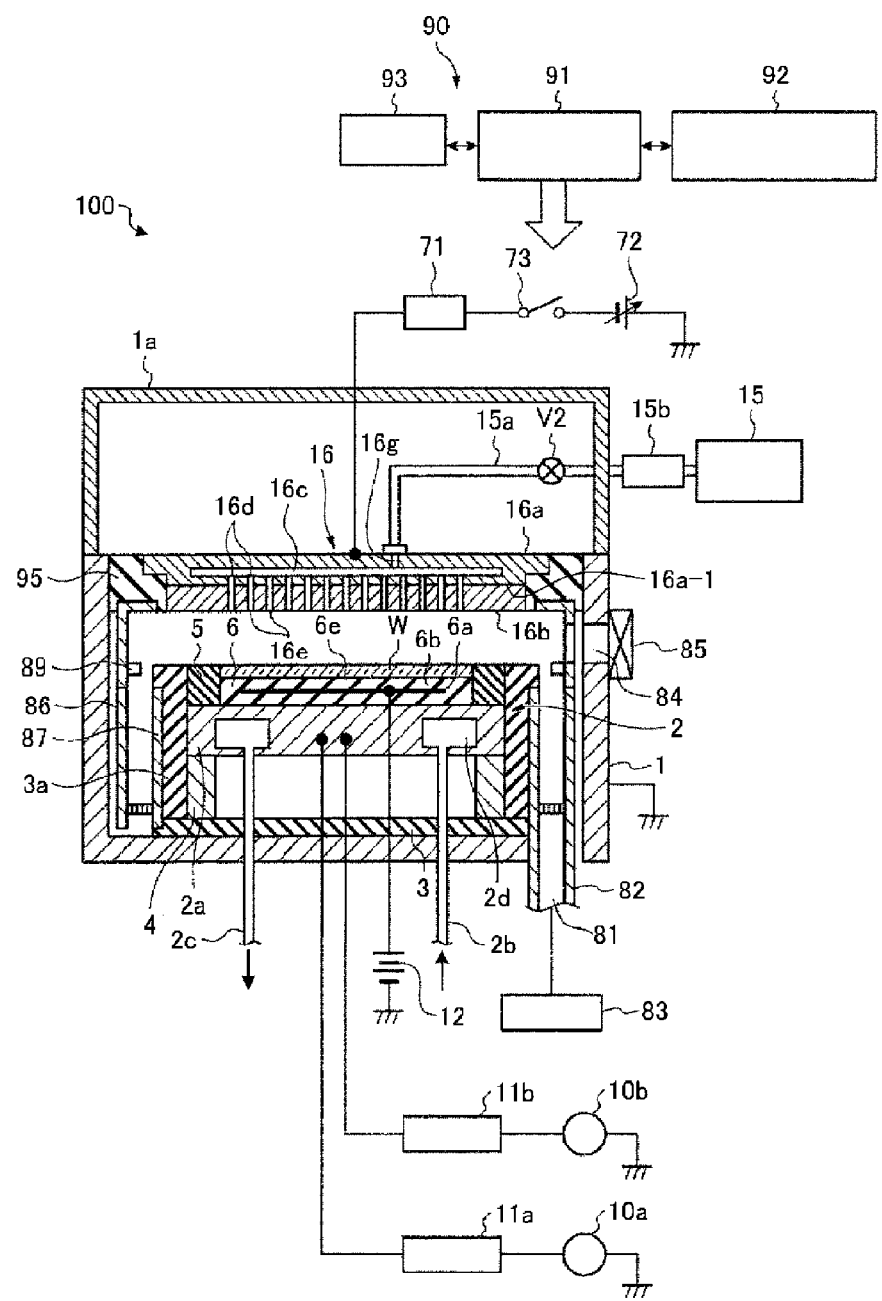
FIG. 1 is a schematic cross sectional view illustrating a configuration of a plasma processing apparatus according to a first exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described with reference to the accompanying drawings. In the various drawings, same or corresponding parts will be assigned same reference numerals. In the following, the exemplary embodiment will be explained for a case where a plasma processing apparatus is used as an example of a vacuum processing apparatus.

Conventionally, there is known a plasma processing apparatus configured to perform a plasma processing such as etching on a processing target object such as a semiconductor wafer with plasma. To control a temperature of the processing target object in this plasma processing apparatus, a coolant path is formed within a placing table along a placing surface on which the processing target object is placed. Further, there is proposed a technique of allowing a coolant in a gas-liquid two-phase state to be flown in the coolant path within the placing table.

In the plasma processing apparatus, in case that the coolant in the gas-liquid two-phase state is flown in the coolant path within the placing table, it is desirable to form an annular flow whereby all the wall surfaces of the coolant path are covered with a liquid film of the coolant. In case that the placing table is provided such that a placing surface of the placing table is disposed to be horizontal and faces upwards with respect to gravity, the liquid film of the coolant at a certain position of the coolant path within the placing table where the coolant flows in the horizontal direction is moved from a ceiling surface of the coolant path disposed near the placing surface of the placing table to a bottom surface facing the ceiling surface due to an effect of the gravity. If the liquid film of the coolant is moved from the ceiling surface disposed near the placing surface of the placing table to the bottom surface of the coolant path, a thickness of the liquid film of the coolant at the ceiling surface of the coolant path is thinned. Further, since plasma is formed near the placing surface of the placing table, evaporation of the coolant at the ceiling surface of the coolant path is accelerated by heat applied from the plasma. As a result, there occurs a dry-out phenomenon that the liquid film of the coolant on the ceiling surface of the coolant path disappears. In the plasma processing apparatus, if the dry-out occurs at the ceiling surface of the coolant path, a heat transfer rate of the coolant is locally deteriorated, resulting in deterioration of uniformity of a temperature distribution on the placing surface of the placing table.

First Exemplary Embodiment

[Configuration of Plasma Processing Apparatus]

FIG. 1 is a schematic cross sectional view illustrating a configuration of a plasma processing apparatus 100 according to a first exemplary embodiment. The plasma processing apparatus 100 has a processing vessel 1 which is hermetically sealed and is electrically grounded. The processing vessel 1 is of a cylindrical shape and is made of, by way of non-limiting example, aluminum. The processing vessel 1 forms a processing space in which plasma is formed. A placing table 2 configured to support a semiconductor wafer (hereinafter, simply referred to as "wafer") W as a processing target substrate is provided within the processing vessel 1. The placing table 2 includes a base 2a and an electrostatic chuck (ESC) 6. The electrostatic chuck 6 corresponds to a substrate placing member, and the base 2a corresponds to a supporting member.

The base 2a has a substantially circular column shape and is made of a conductive metal, for example, aluminum. The base 2a serves as a lower electrode. The base 2a is supported by a supporting table 4. The supporting table 4 is supported by a supporting member 3 made of, by way of example, quartz. A cylindrical inner wall member 3a made of, by way of example, quartz is disposed around the base 2a and the supporting table 4.

A first RF power supply 10a and a second RF power supply 10b are connected to the base 2a via a first matching device 11a and a second matching device 11b, respectively. The first RF power supply 10a is for plasma formation and is configured to supply a high frequency power of a preset frequency to the base 2a of the placing table 2. Further, the second RF power supply 10b is for ion attraction (bias) and is configured to supply a high frequency power having a preset frequency lower than that of the first RF power supply 10a to the base 2a of the placing table 2.

The electrostatic chuck 6 has a disk shape having a flat top surface, and this top surface is configured as a placing surface 6e on which the wafer W is placed. The electrostatic chuck 6 includes an insulator 6b and an electrode 6a embedded in the insulator 6b, and the electrode 6a is connected with a DC power supply 12. The wafer W is attracted to the electrostatic chuck 6 by a Coulomb force generated by a DC voltage applied to the electrode 6a from the DC power supply 12.

Further, an annular edge ring 5 is disposed to surround the electrostatic chuck 6. The edge ring 5 is made of, by way of non-limiting example, single crystalline silicon and is supported by the base 2a. The edge ring 5 is also called a focus ring.

A coolant path 2d is formed within the base 2a. A coolant inlet line 2b is connected to one end of the coolant path 2d, and a coolant outlet line 2c is connected to the other end of the coolant path 2d. The coolant path 2d is connected via the coolant inlet line 2b and the coolant outlet line 2c to a heat exchanger, a compressor, a condenser and an expansion valve which are provided at an outside of the processing vessel 1, and the coolant in the gas-liquid two-phase state is circulated in the coolant path 2d. That is, in the base 2a, a direct expansion type coolant circulation system is constructed by the coolant path 2d, the coolant inlet line 2b, the coolant outlet line 2c, the heat exchanger, the compressor, the condenser, the expansion valve and so forth. In the plasma processing apparatus 100, the coolant in the gas-liquid two-phase state is flown in the coolant path 2d within the placing table 2, and the placing table 2 is cooled by latent heat generated when a liquid film of this coolant evaporates. Accordingly, the placing surface 6e of the placing table 2 is controlled to a preset temperature.

Furthermore, the plasma processing apparatus 100 may be configured to control a temperature of the wafer W respectively by supplying a cold heat transfer gas to a rear surface of the wafer W. By way of example, a gas supply line for supplying the cold heat transfer gas (backside gas) such as a helium gas to the rear surface of the wafer W may be provided to penetrate the placing table 2 or the like. The gas supply line is connected to a non-illustrated gas source. With this configuration, the wafer W attracted to and held on the top surface of the placing table 2 by the electrostatic chuck 6 is controlled to a preset temperature.

Meanwhile, a shower head 16 serving as an upper electrode is disposed above the placing table 2, facing the placing table 2 in parallel. The shower head 16 and the placing table 2 serve as a pair of electrodes (upper electrode and lower electrode).

The shower head 16 is disposed at a ceiling portion of the processing vessel 1. The shower head 16 is equipped with a supporting member 16a and a ceiling plate 16b forming an electrode plate. The shower head 16 is supported at an upper portion of the processing vessel 1 with an insulating member 95 therebetween. The supporting member 16a is made of a conductive material, for example, aluminum having an anodically oxidized top surface, and a bottom surface of the supporting member 16a is configured as a supporting surface 16a-1 at which the ceiling plate 16b is detachably supported.

A gas diffusion space 16c is formed within the supporting member 16a. Further, a multiple number of gas through holes 16d are formed at a bottom portion of the supporting member 16a to be located at a lower portion of the gas diffusion space 16c. Further, the ceiling plate 16b is provided with gas inlet holes 16e which are formed through the ceiling plate 16b in a thickness direction thereof to be overlapped with the gas through holes 16d, respectively. With this configuration, a processing gas supplied into the gas diffusion space 16c is supplied into the processing vessel 1 through the gas through holes 16d and the gas inlet holes 16e while being distributed in a shower shape.

The supporting member 16a is provided with a gas inlet opening 16g through which the processing gas is introduced into the gas diffusion space 16c. One end of a gas supply line 15a is connected to the gas inlet opening 16g, and the other end of this gas supply line 15a is connected to a processing gas source (gas supply) 15 configured to supply a processing gas. The gas supply line 15a is provided with a mass flow controller (MFC) 15b and an opening/closing valve V2 in sequence from the upstream side. A processing gas for plasma etching is supplied from the processing gas source 15 into the gas diffusion space 16c through the gas supply line 15a. The processing gas is supplied from this gas diffusion space 16c into the processing vessel 1 through the gas through holes 16d and the gas inlet holes 16e while being distributed in a shower shape.

The aforementioned shower head 16 configured as the upper electrode is electrically connected with a variable DC power supply 72 via a low pass filter (LPF) 71. This variable DC power supply 72 is configured to turn on/off a power feed by an on/off switch 73. A current/voltage of the variable DC power supply 72 and an on/off operation of the on/off switch 73 are controlled by a controller 90 to be described later. Further, as will be described later, when plasma is formed in the processing space as the high frequency powers from the first RF power supply 10a and the second RF power supply 10b are applied to the placing table 2, the on/off switch 73 is turned on by the controller 90 when necessary, and a preset DC voltage is applied to the shower head 16 serving as the upper electrode.

A cylindrical grounding conductor 1a extends upwards from a sidewall of the processing vessel 1 to be higher than a height position of the shower head 16. This cylindrical grounding conductor 1a has a ceiling wall at a top portion thereof.

An exhaust port 81 is formed at a bottom of the processing vessel 1. The exhaust port 81 is connected with a first exhaust device 83 via an exhaust line 82. The first exhaust device 83 has a vacuum pump and is configured to decompress the processing vessel 1 to a preset vacuum level by operating the vacuum pump. Meanwhile, a carry-in/out opening 84 for the wafer W is formed at the sidewall of the processing vessel 1, and a gate valve 85 configured to open or close the carry-in/out opening 84 is provided at the carry-in/out opening 84.

A deposition shield 86 is provided along an inner wall surface of the sidewall of the processing vessel 1. The deposition shield 86 suppresses an etching byproduct (deposit) from adhering to the processing vessel 1. A conductive member (GND block) 89, which is connected such that a potential thereof with respect to the ground is controllable, is provided at the deposition shield 86 substantially on a level with the wafer W. The conductive member 89 is configured to suppress an abnormal discharge. Further, a deposition shield 87 extending along the inner wall member 3a is provided at a lower end portion of the deposition shield 86. The deposition shields 86 and 87 are provided in a detachable manner.

An overall operation of the plasma processing apparatus 100 having the above-described configuration is controlled by the controller 90. The controller 90 includes a process controller 91 having a CPU and configured to control the individual components of the plasma processing apparatus 100; a user interface 92; and a storage 93.

The user interface 92 includes a keyboard through which a process manager inputs commands to manage the plasma processing apparatus 100; a display configured to visually display an operational status of the plasma processing apparatus 100; and so forth.

The storage 93 stores therein a control program (software) for implementing various processings performed in the plasma processing apparatus 100 under the control of the process controller 91; and a recipe in which processing condition data or the like are stored. When necessary, a required recipe is retrieved from the storage 93 in response to an instruction from the user interface 92 and executed by the process controller 91, so that a required processing is performed in the plasma processing apparatus 100 under the control of the process controller 91. Further, the control program and the recipe including the processing condition data may be used by being stored in a computer-readable recording medium (for example, a hard disk, a CD, a flexible disk, a semiconductor memory, or the like). Alternatively, the control program and the recipe including the processing condition data may be used on-line by being transmitted through, for example, a dedicated line whenever necessary.

[Configuration of Major Components of Placing Table]

Figure 2:
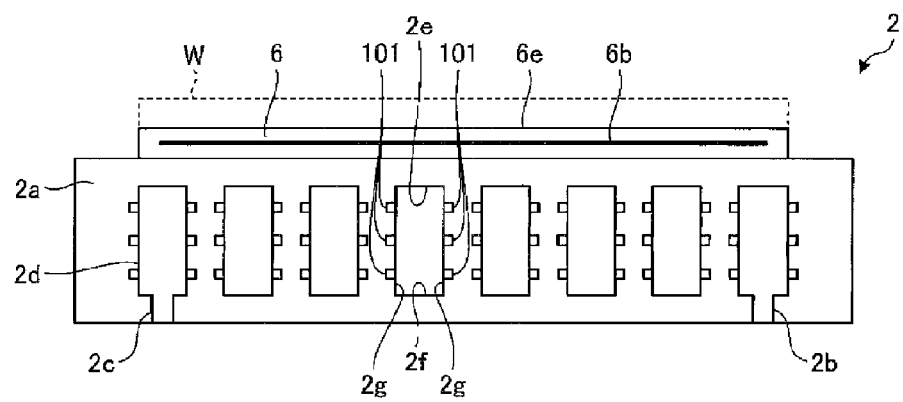
FIG. 2 is a schematic cross sectional view illustrating an example configuration of major components of a placing table according to the first exemplary embodiment.

Now, referring to FIG. 2, a configuration of major components of the placing table 2 will be elaborated. FIG. 2 is a schematic cross sectional view illustrating an example configuration of the major components of the placing table 2 according to the first exemplary embodiment.

The placing table 2 includes the base 2a and the electrostatic chuck 6. The electrostatic chuck 6 has a circular plate shape and is provided coaxially with the base 2a. The top surface of the electrostatic chuck 6 is configured as the placing surface 6e on which the wafer W is placed. The placing surface 6e receives the heat from the plasma as a heat source. The placing surface 6e is an example of a heat receiving surface, and the placing table 2 is an example of a heat receiving member.

Within the base 2a, the coolant path 2d is formed along the placing surface 6e. The coolant inlet line 2b and the coolant outlet line 2c are connected to the coolant path 2d from a rear surface side of the base 2a with respect to the placing surface 6e. The coolant in the gas-liquid two-phase state is introduced into the coolant path 2d from the coolant inlet line 2b, and the coolant flown in the coolant path 2d is discharged from the coolant outlet line 2c. When viewed from a flow direction of the coolant, the coolant path 2d has, for example, a rectangular cross sectional shape. In the present exemplary embodiment, when viewed from the flow direction of the coolant, the coolant path 2d has a ceiling surface 2e disposed near the placing surface 6e, a bottom surface 2f opposite from the ceiling surface 2e and a pair of inner side surfaces 2g intersecting with the ceiling surface 2e. The ceiling surface 2e is an example of a first inner wall surface; the inner side surfaces 2g, an example of a second inner wall surface; and the bottom surface 2f, an example of a third inner wall surface.

The coolant path 2d is provided with, at the pair of inner side surfaces 2g intersecting with the ceiling surface 2e disposed near the placing surface 6e, a multiple number of first grooves 101 extending in an inclined direction toward the ceiling surface 2e with respect to the flow direction of the coolant. In the present exemplary embodiment, the first grooves 101 extend upwardly in the inclined direction with respect to the flow direction of the coolant. Hereinafter, when the first grooves 101 need not be particularly distinguished from each other, these grooves will be appropriately referred to as "first groove 101".

Figure 3:
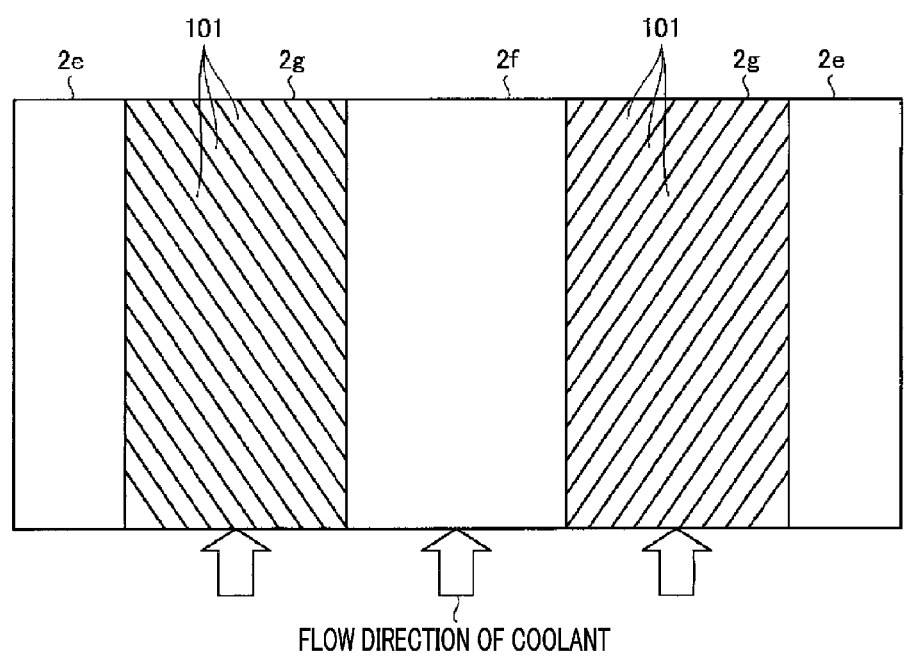
FIG. 3 provides a development view of a coolant path according to the first exemplary embodiment.

FIG. 3 presents a development view of the coolant path 2d according to the first exemplary embodiment. FIG. 3 shows a state in which the coolant path 2d is cut along a central line of the ceiling surface 2e, and the ceiling surface 2e, the bottom surface 2f and the pair of inner side surfaces 2g are illustrated on the same plane. As depicted in FIG. 3, the coolant path 2d has, at the pair of inner side surfaces 2g, the first grooves 101 extending upwards in the inclined direction with respect to the flow direction (indicated by arrows) of the coolant. In the present exemplary embodiment, the first grooves 101 extend from the bottom surface 2f toward the ceiling surface 2e of the coolant path 2d.

In the plasma processing apparatus 100, when the coolant in the gas-liquid two-phase state is flown in the coolant path 2d within the placing table 2, it is desirable to form an annular flow whereby all the wall surfaces of the coolant path 2d are covered with the liquid film of the coolant. For example, it is desirable that the ceiling surface 2e, the bottom surface 2f and the pair of inner side surfaces 2g of the coolant path 2d are covered with the liquid film of the coolant. The liquid film of the coolant flowing in the horizontal direction, however, moves from the ceiling surface 2e of the coolant path 2d disposed near the placing surface 6e of the placing table 2 to the bottom surface 2f facing the ceiling surface 2e due to an effect of gravity. If the liquid film of the coolant is moved from the ceiling surface 2e disposed near the placing surface 6e of the placing table 2 toward the bottom surface 2f, a thickness of the liquid film of the coolant at the ceiling surface 2e of the coolant path 2d is thinned. Further, if the plasma is formed near the placing surface 6e of the placing table 2, evaporation of the coolant is accelerated from the ceiling surface 2e of the coolant path 2d due to the heat applied from the plasma. For the reason, there occurs the dry-out phenomenon that the liquid film of the coolant on the ceiling surface 2e of the coolant path 2d disappears. In the plasma processing apparatus 100, if the dry-out takes place on the ceiling surface 2e of the coolant path 2d, a heat transfer rate of the coolant is locally reduced, resulting in deterioration of uniformity of the temperature distribution in the placing surface 6e of the placing table 2.

As a resolution, in the plasma processing apparatus 100, the first grooves 101 extending upwards in the inclined direction with respect to the flow direction of the coolant are formed at the pair of inner side surfaces 2g of the coolant path 2d which intersect with the ceiling surface 2e, as depicted in FIG. 2 and FIG. 3.

[Example of Change in Flow Pattern within Coolant Path 2d Due to First Grooves 101]

Figure 4:
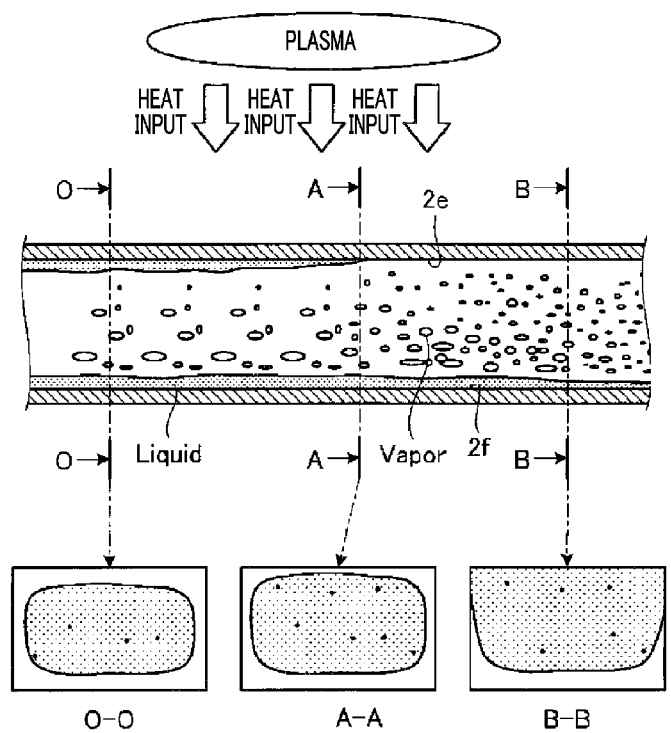
FIG. 4 is an explanatory diagram schematically illustrating a state of a coolant flowing in the coolant path.
Figure 5:
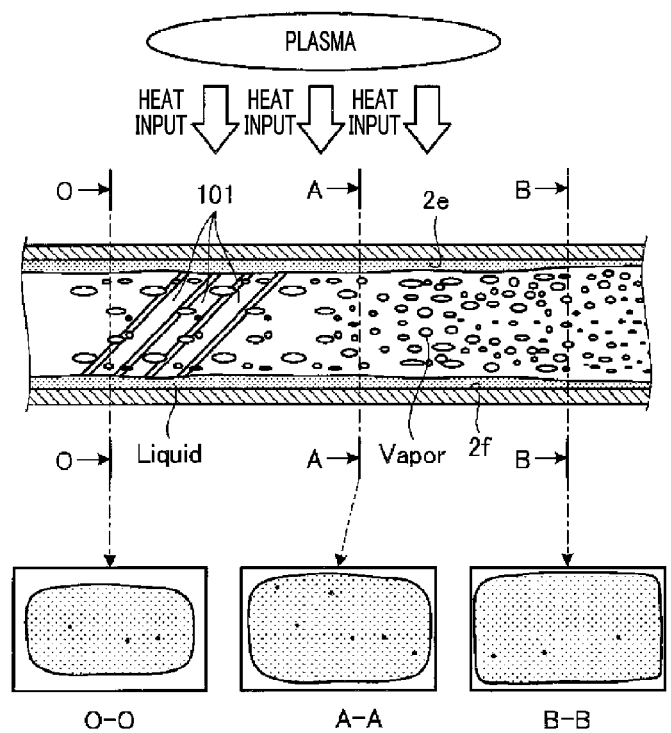
FIG. 5 is an explanatory diagram schematically illustrating a state of the coolant flowing in the coolant path.

Referring to FIG. 4 and FIG. 5, a change in a flow pattern in the coolant path 2d caused by the formation of the first grooves 101 at the pair of inner side surfaces 2g of the coolant path 2d which intersect with the ceiling surface 2e will be explained. FIG. 4 and FIG. 5 are explanatory diagrams schematically illustrating a state of the coolant flowing in the coolant path 2d. FIG. 4 illustrates a state in which the first grooves 101 are not provided at the pair of inner side surfaces 2g of the coolant path 2d which intersect with the ceiling surface 2e. FIG. 5 illustrates a state in which the first grooves 101 are provided at the pair of inner side surfaces 2g of the coolant path 2d which intersect with the ceiling surface 2e. Further, in FIG. 4 and FIG. 5, the coolant in the gas-liquid two-phase state flows from the left to the right.

As depicted in FIG. 4, in case that the coolant in the gas-liquid two-phase state flows in the coolant path 2d within the placing table 2 in the horizontal direction, the liquid film of the coolant is moved from the ceiling surface 2e disposed near the placing surface 6e of the placing table 2 to the bottom surface 2f due to the effect of the gravity. In a lower part of FIG. 4, states of the coolant on three cross-sections (an O-O cross section, an A-A cross section and a B-B cross section) of the coolant path 2d, which are perpendicular to the flow direction of the coolant, are respectively illustrated. The liquid film of the coolant is moved from the ceiling surface 2e disposed near the placing surface 6e of the placing table 2 to the bottom surface 2f as the coolant flows to the downstream side. If the liquid film of the coolant is moved from the ceiling surface 2e of the coolant path 2d disposed near the placing surface 6e of the placing table 2 to the bottom surface 2f, the thickness of the liquid film of the coolant at the ceiling surface 2e of the coolant path 2d is thinned. Further, if the plasma is formed above the coolant path 2d, the evaporation of the coolant at the ceiling surface 2e is accelerated due to the heat applied from the plasma. As a result, there occurs the dry-out phenomenon that the liquid film of the coolant at the ceiling surface 2e of the coolant path 2d disappears. In the example of FIG. 4, the B-B cross section shows the dry-out occurring at the ceiling surface 2e. If the dry-out takes place at the ceiling surface 2e, the heat transfer rate of the coolant is locally reduced in a region downstream of the B-B cross section of the coolant path 2d. As a result, the uniformity of the temperature distribution in the placing surface 6e of the placing table 2 is deteriorated.

Meanwhile, if the first grooves 101 are provided at the pair of inner side surfaces 2g of the coolant path 2d intersecting with the ceiling surface 2e, as depicted in FIG. 5, the first grooves 101 allow the liquid film of the coolant to be moved from the bottom surface 2f to the ceiling surface 2e against the gravity. That is, the first grooves 101 transport the liquid film of the coolant to the ceiling surface 2e. Accordingly, the thickness of the liquid film of the coolant on the ceiling surface 2e of the coolant path 2d is increased. Since the liquid film of the coolant is transported to the ceiling surface 2e by the first grooves 101, the liquid film of the coolant is replenished to the ceiling surface 2e even if the coolant at the ceiling surface 2e evaporates due to the heat from the plasma. Accordingly, the occurrence of the dry-out at the ceiling surface 2e disposed near the placing surface 6e of the placing table 2 is suppressed, so that the reduction of the heat transfer rate of the coolant is suppressed. As a consequence, the uniformity of the temperature distribution in the placing surface 6e of the placing table 2 can be improved.

Further, as for a surface state of the pair of inner side surfaces 2g having the first grooves 101, it is desirable that the inner side surfaces 2g have low surface tension, low friction coefficient and high water repellency with respect to the liquid film of the coolant. The water repellency is in inverse proportion to wetting property and hydrophilic property. Accordingly, a resistance is reduced when the coolant is flown in the coolant path 2d, so that a pressure loss of the coolant can be further reduced.

The plasma processing apparatus 100 according to the present exemplary embodiment described so far includes the placing table 2 and the coolant path 2d. The placing table 2 has the placing surface 6e on which the wafer W as a plasma processing target is placed. The coolant path 2d is formed within the placing table 2 along the placing surface 6e thereof, and the coolant in the gas-liquid two-phase state flows in this coolant path 2d. The coolant path 2d has, at the pair of inner side surfaces 2g intersecting with the ceiling surface 2e disposed near the placing surface 6e, the first grooves 101 extending upwardly in the inclined direction with respect to the flow direction of the coolant. With this configuration, the plasma processing apparatus 100 is capable of improving the uniformity of the temperature distribution in the placing surface 6e of the placing table 2.

Second Exemplary Embodiment

A second exemplary embodiment pertains to a variation of a length of the first grooves 101 in the coolant path 2d.

Figure 6:
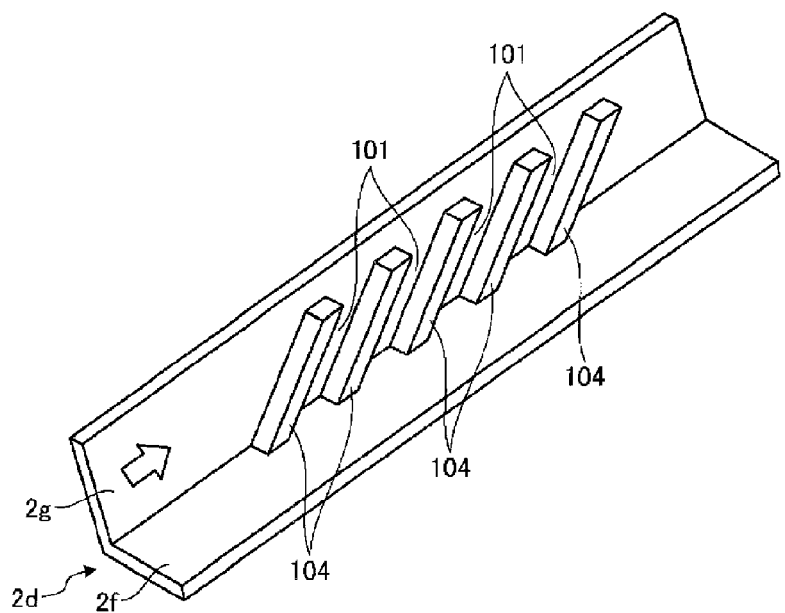
FIG. 6 is a perspective view schematically illustrating an inside of a coolant path according to a second exemplary embodiment.
Figure 7:
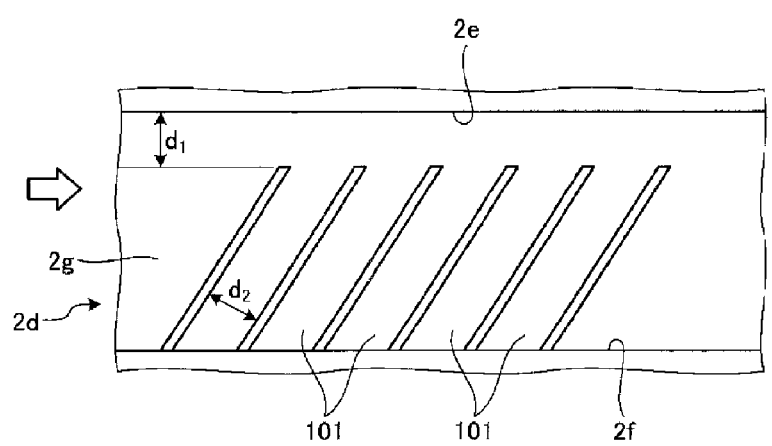
FIG. 7 is a side view schematically illustrating the inside of the coolant path according to the second exemplary embodiment.

FIG. 6 is a perspective view schematically illustrating an inside of the coolant path 2d according to the second exemplary embodiment. FIG. 7 is a side view schematically illustrating the inside of the coolant path 2d according to the second exemplary embodiment. Further, in FIG. 6, illustration of the ceiling surface 2e and one of the pair of inner side surfaces 2g of the coolant path 2d is omitted for the convenience of explanation. As shown in FIG. 6 and FIG. 7, the coolant path 2d has, at the pair of inner side surfaces 2g thereof, the first grooves 101 extending upwards in the inclined direction with respect to the flow direction (indicated by an arrow) of the coolant. The first grooves 101 are formed between the plurality of protrusions 104 provided at each of the inner side surfaces 2g. The first grooves 101 may be formed by performing a cutting work on the pair of inner side surfaces 2g to form the plurality of protrusions 104, or may be formed by providing the plurality of protrusions 104 as another member on the pair of inner side surfaces 2g. The first grooves 101 extend from the bottom surface 2f of the coolant path 2d toward the ceiling surface 2e to have a length not to reach the ceiling surface 2e, and a gap of a preset width $d_1$ is formed between the first grooves 101 and the ceiling surface 2e. Since the gap of the preset width $d_1$ is formed between the first grooves 101 and the ceiling surface 2e, the liquid film of the coolant transported from the first grooves 101 to the ceiling surface 2e smoothly passes through this gap along the flow direction (indicated by the arrow) of the coolant. Accordingly, a pressure loss of the coolant can be reduced.

If the width $d_1$ of the gap between the first groove 101 and the ceiling surface 2e is too small for a depth h of the first groove 101, the liquid film of the coolant passing through this gap is decreased. Thus, it is desirable that the width $d_1$ of the gap between the first groove 101 and the ceiling surface 2e is equal to or larger than the depth h of the first groove 101. With this configuration, the liquid film of the coolant passing through the gap between the first groove 101 and the ceiling surface 2e is increased, so that the pressure loss of the coolant can be further reduced.

Furthermore, if the width $d_1$ of the gap between the first groove 101 and the ceiling surface 2e is too large for a width $d_2$ of the first groove 101 or too small for the width $d_2$ of the first groove 101, the liquid film of the coolant passing through this gap is decreased. Thus, it is desirable that the width $d_1$ and the width $d_2$ satisfy a condition of $0.5 < d_2/d_1 < 2$. With this configuration, the liquid film of the coolant passing through the gap between the first groove 101 and the ceiling surface 2e is increased, so that the pressure loss of the coolant can be further reduced.

Regarding a surface state of the pair of inner side surfaces 2g having the first grooves 101 and the protrusions 104, it is desirable that the inner side surfaces 2g have low surface tension, low friction coefficient and high water repellency with respect to the liquid film of the coolant. Accordingly, a resistance when the coolant flows in the coolant path 2d is lowered, so that the pressure loss of the coolant can be further reduced.

In a plasma processing apparatus 100 according to the present exemplary embodiment, the first grooves 101 extend toward the ceiling surface 2e to have the length not to reach the ceiling surface 2e, and the gap having the preset width $d_1$ is formed between the first grooves 101 and the ceiling surface 2e. With this configuration, the pressure loss of the coolant can be reduced.

Third Exemplary Embodiment

A plasma processing apparatus 100 according to a third exemplary embodiment has the same configuration as that of the plasma processing apparatus 100 according to the second exemplary embodiment except that second grooves are provided at the bottom surface 2f of the coolant path 2d.

Figure 8:
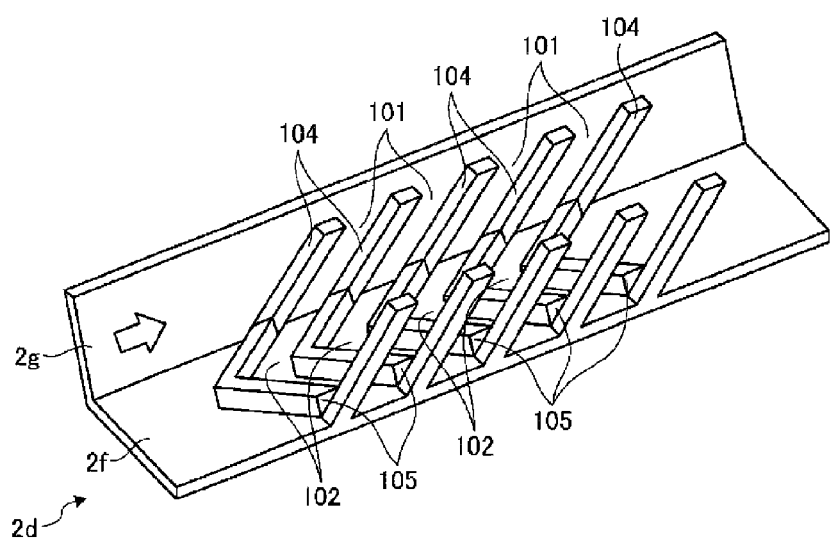
FIG. 8 is a perspective view schematically illustrating an inside of a coolant path according to a third exemplary embodiment.
Figure 9:
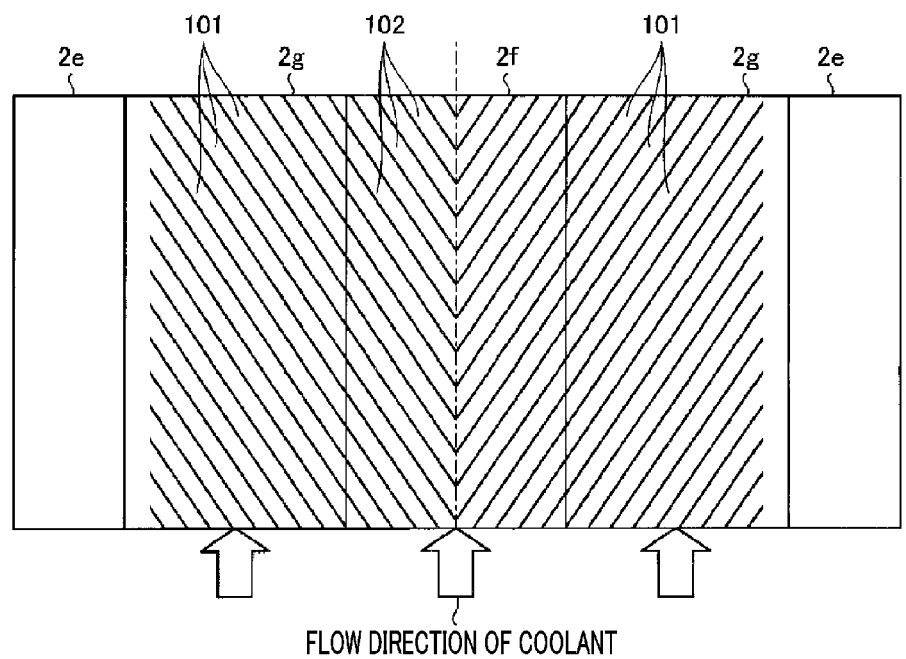
FIG. 9 presents a development view of the coolant path according to the third exemplary embodiment.

FIG. 8 is a perspective view schematically illustrating an inside of the coolant path 2d according to the third exemplary embodiment. FIG. 9 is a development view of the coolant path 2d according to the third exemplary embodiment. Further, in FIG. 8, illustration of the ceiling surface 2e and one of the pair of inner side surfaces 2g is omitted for the convenience of explanation. FIG. 9 shows a state in which the coolant path 2d is cut along a central line of the ceiling surface 2e, and the ceiling surface 2e, the bottom surface 2f and the pair of inner side surfaces 2g are illustrated on the same plane. As depicted in FIG. 8 and FIG. 9, the coolant path 2d has, at the pair of inner side surfaces 2g thereof, the first grooves 101 extending upwards in the inclined direction with respect to the flow direction (indicated by arrows) of the coolant. The first grooves 101 are formed between the plurality of protrusions 104 provided at the inner side surfaces 2g. The first grooves 101 may be formed by performing a cutting work on the pair of inner side surfaces 2g to form the plurality of protrusions 104, or may be formed by providing the plurality of protrusions 104 as another member on the pair of inner side surfaces 2g. The first grooves 101 extend from the bottom surface 2f of the coolant path 2d toward the ceiling surface 2e to have a length not to reach the ceiling surface 2e, and the gap of the preset width $d_1$ is formed between the first grooves 101 and the ceiling surface 2e.

Further, the coolant path 2d also has, at the bottom surface 2f thereof, the second grooves 102 extending from a central line of the bottom surface 2f along the flow direction (indicated by the arrow) of the coolant to the inner side surfaces 2g with this central line therebetween. The second grooves 102 are connected to the first grooves 101. The second grooves 102 are formed between a plurality of protrusions 105 provided at the bottom surface 2f. The second grooves 102 may be formed by performing a cutting work on the bottom surface 2f to form the plurality of protrusions 105, or may be formed by providing the plurality of protrusions 105 as another member on the bottom surface 2f. In the present exemplary embodiment, when the ceiling surface 2e, the bottom surface 2f and the pair of inner side surfaces 2g are developed on the same plane as illustrated in FIG. 9, the second grooves 102 are connected to the first grooves 101 on extension lines of the first grooves 101.

Further, regarding a surface state of the pair of inner side surfaces 2g having the first grooves 101 and the protrusions 104 and a surface state of the bottom surface 2f having the second grooves 102 and the protrusions 105, it is desirable that the inner sides surfaces 2g and the bottom surface 2f have low surface tension, low friction coefficient and high water repellency with respect to a liquid film of the coolant. Accordingly, a resistance is reduced when the coolant is flown in the coolant path 2d, so that a pressure loss of the coolant can be further reduced.

In the plasma processing apparatus 100 according to the present exemplary embodiment as described above, the coolant path 2d has, at the bottom surface 2f opposite from the ceiling surface 2e, the second grooves 102 which extend from the central line along the flow direction of the coolant to the inner side surfaces 2g with this central line therebetween and which are connected to the first grooves 101. With this configuration, the second grooves 102 transport the liquid film of the coolant from the bottom surface 2f to the inner side surfaces 2g, and the first grooves 101 transport the liquid film of the coolant, which has been transported to the inner side surfaces 2g through the second grooves 102, to the ceiling surface 2e. Accordingly, the occurrence of the dry-out at a ceiling surface 2e disposed near the placing surface 6e of the placing table 2 can be further suppressed, so that the decrease of the heat transfer rate of the coolant can be further suppressed. As a result, in the plasma processing apparatus 100, the uniformity of the temperature distribution in the placing surface 6e of the placing table 2 can be further improved.

Fourth Exemplary Embodiment

A fourth exemplary embodiment is directed to a variation of an inclination angle of the first grooves 101 in the coolant path 2d.

Figure 10:
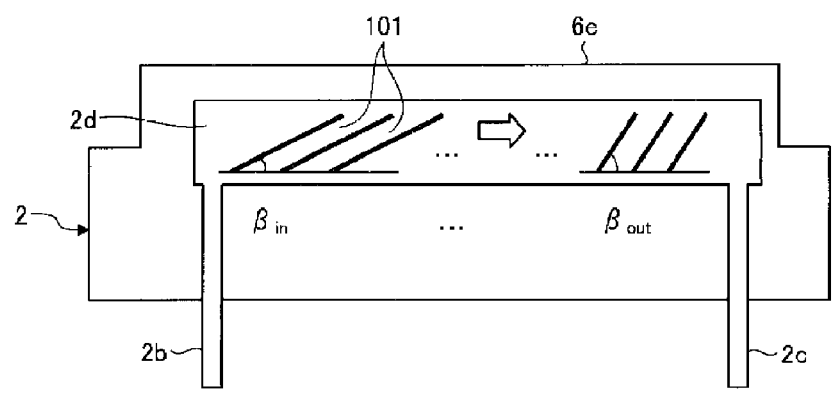
FIG. 10 is a side view schematically illustrating an inside of a coolant path according to a fourth exemplary embodiment.

FIG. 10 is a side view schematically illustrating an inside of the coolant path 2d according to the fourth exemplary embodiment. As depicted in FIG. 10, the coolant path 2d has, at the pair of inner side surfaces 2g thereof, the plurality of first grooves 101 extending upwards in an inclined direction with respect to the flow direction (indicated by an arrow) of the coolant. Each of the first grooves 101 extends from the bottom surface 2f of the coolant path 2d toward the ceiling surface 2e to have the length not to reach the ceiling surface 2e, and the gap having the preset width $d_1$ is formed between the first grooves 101 and the ceiling surface 2e.

Further, an inclination angle of each first groove 101 with respect to the flow direction (indicated by the arrow) of the coolant is equal to or larger than the inclination angle of the first groove 101 located upstream of the corresponding each first groove 101 in the flow direction of the coolant. For example, an inclination angle $\beta_{out}$ of the first groove 101 located near the coolant outlet line 2c is larger than an inclination angle $\beta_{in}$ of the first groove 101 located near the coolant inlet line 2b. With this configuration, in the first grooves 101, the amount of the coolant transported to the ceiling surface 2e can be increased as the first grooves 101 approach a downstream side of the flow direction of the coolant. Further, the inclination angles of the first grooves 101 with respect to the flow direction (indicated by the arrow) of the coolant may be gradually increased along the flow direction of the coolant (indicated by the arrow).

In the plasma processing apparatus 100 according to the present exemplary embodiment, the inclination angle of each first groove 101 with respect to the flow direction (indicated by the arrow) of the coolant is equal to or larger than the inclination angle of the first groove 101 located upstream of the corresponding each first groove 101 in the flow direction of the coolant. Accordingly, the first grooves 101 can increase the amount of the coolant transported to the ceiling surface 2e as the first grooves 101 approach the downstream side of the flow direction of the coolant. Therefore, the occurrence of the dry-out at the ceiling surface 2e disposed near the placing surface 6e of the placing table 2 can be further suppressed, so that the decrease of the heat transfer rate of the coolant can be further suppressed. As a result, in the plasma processing apparatus 100, the uniformity of the temperature distribution in the placing surface 6e of the placing table 2 can be further improved.

Fifth Exemplary Embodiment

A fifth exemplary embodiment is directed to a variation of a depth of the first grooves 101 in the coolant path 2d.

Figure 11:
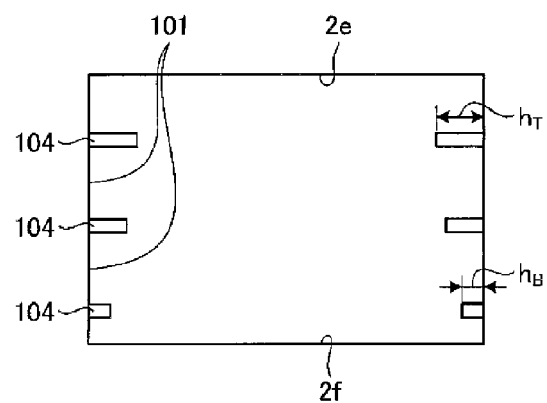
FIG. 11 is a cross sectional view schematically illustrating an inside of a coolant path according to a fifth exemplary embodiment.

FIG. 11 is a cross sectional view schematically illustrating an inside of the coolant path 2d according to a fifth exemplary embodiment. FIG. 11 illustrates a cross section of the coolant path 2d perpendicular to the flow direction of the coolant. As depicted in FIG. 11, the coolant path 2d has, at the pair of inner side surfaces 2g thereof, the plurality of first grooves 101 extending upwardly in the inclined direction with respect to the flow direction of the coolant. Each of the first grooves 101 extends from the bottom surface 2f of the coolant path 2d toward the ceiling surface 2e to have a length not to reach the ceiling surface 2e, and the gap having the preset width $d_1$ is formed between the first groove 101 and the ceiling surface 2e.

Further, a depth of each first groove 101 is equal to or larger than the depth of the first groove 101 farther from the ceiling surface 2e than the corresponding each first groove 101 is. For example, the depth $h_T$ of the first groove 101 located near the ceiling surface 2e is larger than the depth $h_B$ of the first groove 101 located near the bottom surface 2f. Accordingly, in the first grooves 101, the amount of the coolant transported to the ceiling surface 2e can be increased as the first grooves 101 approach the ceiling surface 2e. Further, to suppress the pressure loss of the coolant in each first groove 101, it is desirable that the depth of each first groove 101 is in a range from 0.02 mm to 0.2 mm. Further, from the same point of view, it is desirable that the depth of each first groove 101 is equal to or smaller than the depth of the first groove 101 located upstream of the corresponding each first groove 101 of the flow direction of the coolant.

In the plasma processing apparatus 100 according to the present exemplary embodiment, the depth of each first groove 101 is equal to or larger than the depth of the first groove 101 farther from the ceiling surface 2e than the corresponding each first groove 101. Accordingly, in the first grooves 101, the amount of the coolant transported to the ceiling surface 2e can be increased as the first grooves 101 approach the ceiling surface 2e. Therefore, the occurrence of the dry-out at the ceiling surface 2e disposed near the placing surface 6e of a placing table 2 can be further suppressed, so that the decrease of the heat transfer rate of the coolant can be further suppressed. As a result, in the plasma processing apparatus 100, the uniformity of the temperature distribution in the placing surface 6e of the placing table 2 can be further improved.

Sixth Exemplary Embodiment

A plasma processing apparatus 100 according to a sixth exemplary embodiment has the same configuration as that of the plasma processing apparatus 100 according to the second exemplary embodiment except that the ceiling surface 2e of the coolant path 2d has protrusions.

Figure 12:
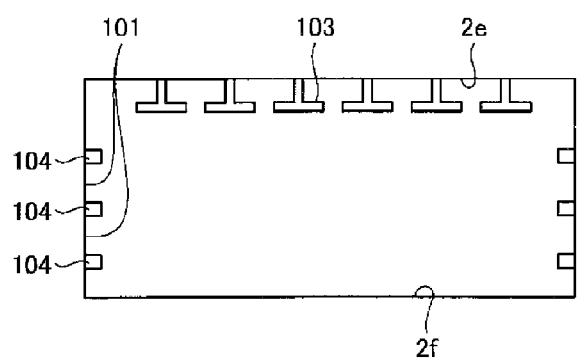
FIG. 12 is a cross sectional view schematically illustrating an inside of a coolant path according to a sixth exemplary embodiment.

FIG. 12 is a cross sectional view schematically illustrating an inside of the coolant path 2d according to the sixth exemplary embodiment. FIG. 12 illustrates a cross section of the coolant path 2d perpendicular to the flow direction of the coolant. As depicted in FIG. 12, the coolant path 2d has, at the pair of inner side surfaces 2g thereof, the plurality of first grooves 101 extending upwardly in the inclined direction with respect to the flow direction of the coolant. The first grooves 101 are formed between the plurality of protrusions 104 provided at each inner side surface 2g. The first grooves 101 may be formed by performing a cutting work on the pair of inner side surfaces 2g to form the plurality of protrusions 104, or may be formed by providing the plurality of protrusions 104 as another member on the pair of inner side surfaces 2g. The first grooves 101 extend from the bottom surface 2f of the coolant path 2d toward the ceiling surface 2e to have a length not to reach the ceiling surface 2e, and the gap having the preset width $d_1$ is formed between the first grooves 101 and the ceiling surface 2e.

Further, the coolant path 2d has a plurality of protrusions 103 on the ceiling surface 2e thereof. Each protrusion 103 has an umbrella shape with a width of a leading end thereof being larger than a width of a base end thereof. Due to the presence of the protrusions 103 on the ceiling surface 2e, the liquid film of the coolant transported to the ceiling surface 2e from the first grooves 101 stay around the plurality of protrusions 103. That is, the protrusions 103 have a function of allowing the liquid film of the coolant transported to the ceiling surface 2e from the first grooves 101 to stay at the ceiling surface 2e. As the liquid film of the coolant is made to stay at the ceiling surface 2e due to the protrusions 103, the thickness of the liquid film of the coolant on the ceiling surface 2e is increased.

Further, instead of the protrusions 103, irregularities or a porous layer may be provided on the ceiling surface 2e. For example, the irregularities may be formed on the ceiling surface 2e by depositing a thermally sprayed film. Alternatively, by depositing a thermally sprayed film so that the thermally sprayed film has pores therein, the porous layer may be formed on the ceiling surface 2e. The thermally sprayed film may be a thermally sprayed metal film such as aluminum or titanium, or a thermally sprayed ceramic film. Further, a coating material may be used instead of the thermally sprayed film. Moreover, when machining the ceiling surface 2e, surface roughness may be adjusted by controlling a degree of polishing.

Further, it is desirable that at least one of the surface tension, the wetting property or the hydrophilic property of the ceiling surface 2e of the coolant path 2d with respect to the liquid film of the coolant is larger than that of the pair of inner side surfaces 2g. For example, in case that the irregularities or the porous layer is provided on the ceiling surface 2e, it is desirable that the surface tension of the ceiling surface 2e with respect to the liquid film of the coolant is larger than the surface tension of the pair of inner side surfaces 2g. Accordingly, the liquid film of the coolant transported to the ceiling surface 2e from the first grooves 101 stay around the protrusions 103, and the thickness of the liquid film of the coolant at the ceiling surface 2e is increased. Furthermore, in case that the irregularities or the porous layer is provided on the ceiling surface 2e, it is desirable that the wetting property or the hydrophilic property of the ceiling surface 2e with respect to the liquid film of the coolant is higher than wetting property or the hydrophilic property of the pair of inner side surfaces 2g. Accordingly, the liquid film of the coolant transported to the ceiling surface 2e from the first grooves 101 is uniformly diffused around the protrusions 103, so that the transported coolant is allowed to stay on the entire ceiling surface 2e with the uniform thickness.

In the plasma processing apparatus 100 according to the present exemplary embodiment as described above, the coolant path 2d has the plurality of protrusions 103 or the irregularities on the ceiling surface 2e thereof. With this configuration, the liquid film of the coolant is allowed to stay on the ceiling surface 2e, and the thickness of the liquid film of the coolant on the ceiling surface 2e is increased. Accordingly, the occurrence of the dry-out at the ceiling surface 2e disposed near the placing surface 6e of the placing table 2 is suppressed, so that the reduction of the heat transfer rate of the coolant is suppressed. As a consequence, in the plasma processing apparatus 100, the uniformity of the temperature distribution in the placing surface 6e of a placing table 2 can be improved.

Seventh Exemplary Embodiment

A plasma processing apparatus 100 according to a seventh exemplary embodiment is different from the plasma processing apparatus 100 according to the first exemplary embodiment in that a coolant in a liquid phase is circulated in the coolant path 2d instead of the coolant in the gas-liquid two-phase state. Since the basic configuration of the plasma processing apparatus 100 according to the seventh exemplary embodiment is the same as that of the plasma processing apparatus 100 according to the first exemplary embodiment, reference is made to FIG. 1 to FIG. 3.

The coolant path 2d is formed within the base 2a. The coolant inlet line 2b is connected to one end of the coolant path 2d, and the coolant outlet line 2c is connected to the other end of the coolant path 2d. The coolant path 2d is connected via the coolant inlet line 2b and the coolant outlet line 2c to a chiller unit provided at an outside of the processing vessel 1, and the coolant in the liquid phase is circulated in the coolant path 2d. That is, in the base 2a, a coolant circulation system is constructed by the coolant path 2d, the coolant inlet line 2b, the coolant outlet line 2c, the chiller unit, and so forth. In the plasma processing apparatus 100, as the coolant in the liquid phase is flown in the coolant path 2d within the placing table 2, the placing table 2 is cooled. Accordingly, the placing surface 6e of the placing table 2 is controlled to a preset temperature.

As illustrated in FIG. 2 and FIG. 3, the coolant path 2d has, at the pair of inner side surfaces 2g intersecting with the ceiling surface 2e disposed near the placing surface 6e, the plurality of first grooves 101 extending in the inclined direction toward the ceiling surface 2e with respect to the flow direction of the coolant. In the present exemplary embodiment, the first grooves 101 extend upwards in the inclined direction with respect to the flow direction of the coolant.

In the plasma processing apparatus 100, the heat applied to the placing surface 6e of the placing table 2 from the plasma tends to be increased while the plasma processing is performed. In the plasma processing apparatus 100, it is expected that cooling efficiency for the placing surface 6e as the heat receiving surface which receives the heat from the plasma can be improved by allowing the coolant in the liquid phase to flow in the coolant path 2d of the placing table 2.

In the plasma processing apparatus 100, the first grooves 101 extending upwards in the inclined direction with respect to the flow direction of the coolant are formed at the pair of inner side surfaces 2g intersecting with the ceiling surface 2e of the coolant path 2d in which the coolant in the liquid phase flows.

By forming the first grooves 101 at the pair of inner side surfaces 2g of the coolant path 2d, the coolant is transported from the bottom surface 2f to the ceiling surface 2e. Accordingly, a flow velocity of the coolant near the ceiling surface 2e is increased larger than a flow velocity of the coolant near the bottom surface 2f. Here, it is known that the heat transfer rate (heat transfer coefficient) of the coolant is in proportion to the flow velocity of the coolant. That is, since the flow velocity of the coolant near the ceiling surface 2e is increased as the coolant is transported from the bottom surface 2f to the ceiling surface 2e disposed near the placing surface 6e due to the presence of the first grooves 101, the heat transfer rate of the coolant in the vicinity of the ceiling surface 2e is improved. As a result, the cooling efficiency for the placing surface 6e as the heat receiving surface can be ameliorated.

The plasma processing apparatus 100 according to the present exemplary embodiment as described above is equipped with the placing table 2 and the coolant path 2d. The placing table 2 has the placing surface 6e as the heat receiving surface which receives the heat from the plasma. The coolant path 2d is formed within the placing table 2 along the placing surface 6e, and the coolant in the liquid phase is flown in this coolant path 2d. The coolant path 2d has, at the pair of inner side surfaces 2g intersecting with the ceiling surface 2e disposed near the placing surface 6e, the first grooves 101 extending in the inclined direction toward the ceiling surface 2e with respect to the flow direction of the coolant. With this configuration, in the plasma processing apparatus 100, even in case that the coolant in the liquid phase is flown in the coolant path 2d within the placing table 2, the cooling efficiency for the placing surface 6e as the heat receiving surface can be improved.

Eighth Exemplary Embodiment

A plasma processing apparatus 100 according to an eighth exemplary embodiment is different from the plasma processing apparatus 100 according to the seventh exemplary embodiment in that a coolant path through which the coolant in the liquid phase is flown is formed within the supporting member 16a of the shower head 16, and first grooves are provided at the pair of inner side surfaces of this coolant path.

Figure 15:
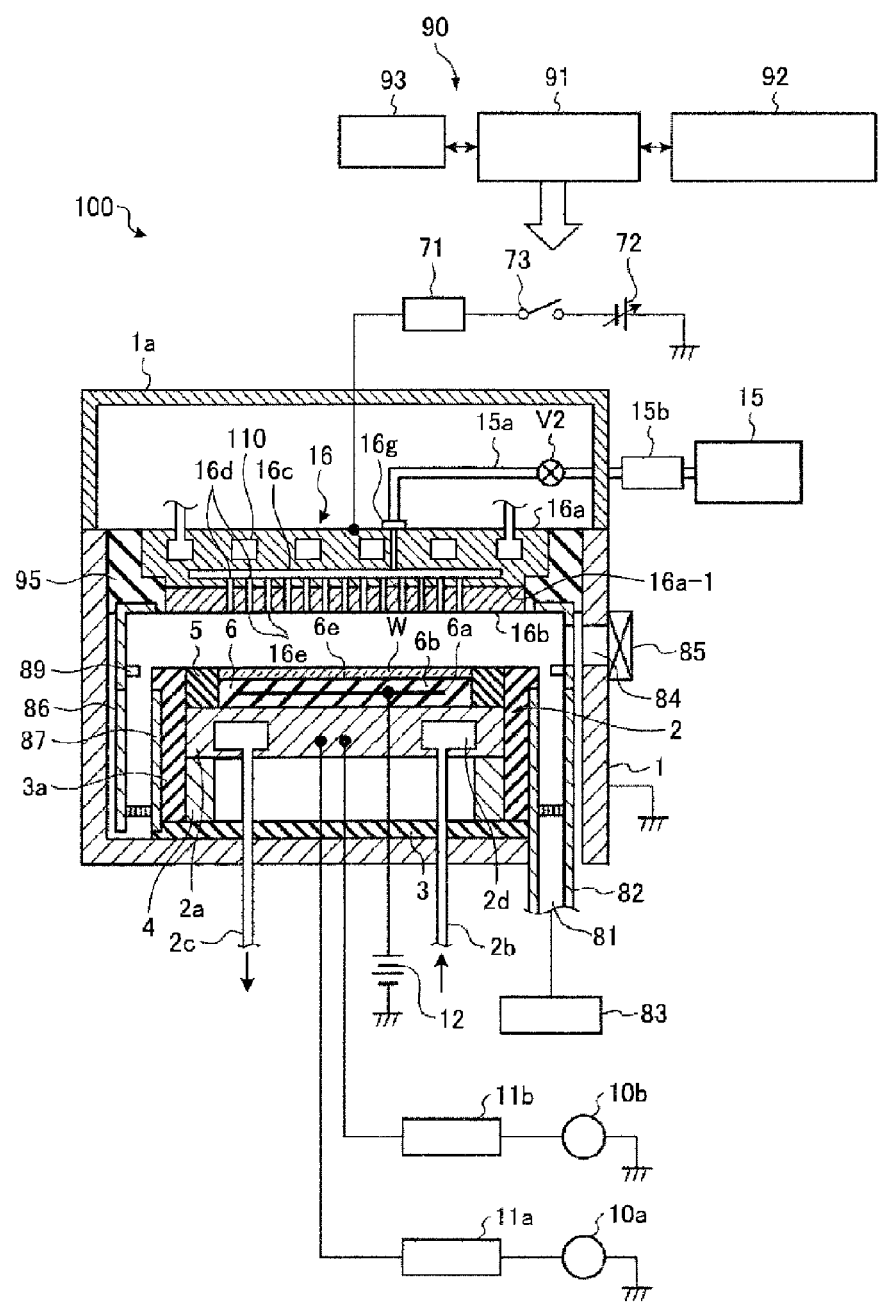
FIG. 15 is a schematic cross sectional view illustrating a configuration of a plasma processing apparatus according to an eighth exemplary embodiment.

FIG. 15 is a schematic cross sectional view illustrating a configuration of the plasma processing apparatus 100 according to the eighth exemplary embodiment. As depicted in FIG. 15, the shower head 16 includes the supporting member 16a and the ceiling plate 16b. The ceiling plate 16b is supported by the supporting member 16a. The bottom surface of the supporting member 16a is configured as the supporting surface 16a-1 on which the ceiling plate 16b is supported.

A coolant path 110 as a temperature control mechanism for controlling a temperature of the ceiling plate 16b is formed within the supporting member 16a. The coolant path 110 is connected via a pipeline to the chiller unit provided at the outside of the processing vessel 1, and the coolant in the liquid phase is supplied into and circulated in the coolant path 110. That is, the shower head 16 constructs a coolant circulation system including the coolant path 110, the pipeline and the chiller unit as the temperature control mechanism. In the plasma processing apparatus 100, as the coolant in the liquid phase is flown in the coolant path 110 within the supporting member 16a, the supporting surface 16a-1 of the shower head 16 is adjusted to a preset temperature. Accordingly, a temperature of the ceiling plate 16b is adjusted.

Figure 16:
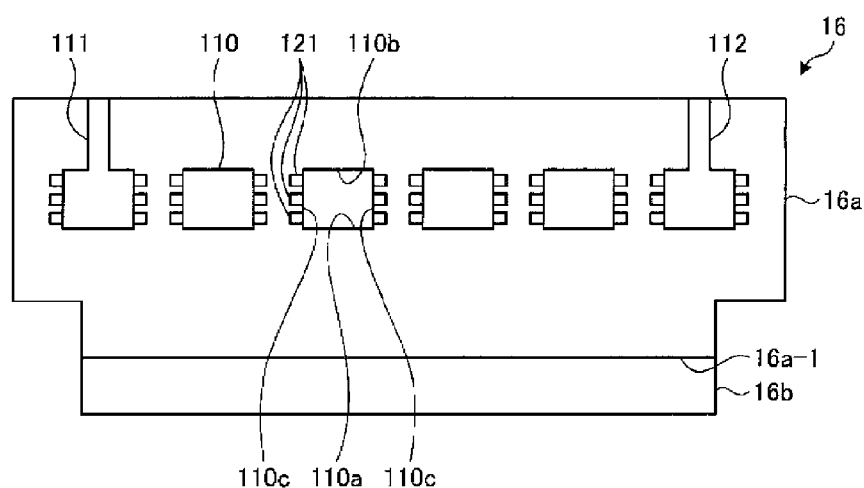
FIG. 16 is a schematic cross sectional view illustrating an example configuration of major components of a shower head according to the eighth exemplary embodiment.

Now, a configuration of major components of the shower head 16 will be explained with reference to FIG. 16. FIG. 16 is a schematic cross sectional view illustrating an example configuration of the major components of the shower head 16 according to the eighth exemplary embodiment. In FIG. 16, the gas diffusion space 16c, the gas through holes 16d and the gas inlet holes 16e are not illustrated for convenience of explanation.

The shower head 16 has the supporting member 16a and the ceiling plate 16b. The ceiling plate 16b is of the circular plate shape and is supported by the supporting member 16a. The ceiling plate 16b is the top plate contacted with the plasma when the plasma processing is performed. The bottom surface of the supporting member 16a is configured as the supporting surface 16a-1 on which the ceiling plate 16b is supported. The supporting surface 16a-1 receives the heat from the plasma as the heat source via the ceiling plate 16b when the plasma processing is performed. The supporting surface 16a-1 is an example of the heat receiving surface, and the supporting member 16a is an example of the heat receiving member.

Within the supporting member 16a, the coolant path 110 is formed along the supporting surface 16a-1. A coolant inlet line 111 and a coolant outlet line 112 are connected to the coolant path 110 from a rear surface side with respect to the supporting surface 16a-1 of the supporting member 16a. The coolant in the liquid phase is introduced into the coolant path 110 through the coolant inlet line 111, and the coolant flown in the coolant path 110 is drained through the coolant outlet line 112. When viewed from a flow direction of the coolant, a cross section of the coolant path 110 has a rectangular shape. In the present exemplary embodiment, when viewed from the flow direction of the coolant, the coolant path 110 has a rectangular shape including the bottom surface 110a disposed near the supporting surface 16a-1, a ceiling surface 110b facing the bottom surface 110a, and a pair of inner side surfaces 110c intersecting with the bottom surface 110a. The bottom surface 110a is an example of a first inner wall surface; the inner side surfaces 110c, an example of a second inner wall surface; and the ceiling surface 110b, an example of a third inner wall surface.

The coolant path 110 has, at the pair of inner side surfaces 110c intersecting with the bottom surface 110a disposed near the supporting surface 16a-1, a plurality of first grooves 121 extending in an inclined direction toward the bottom surface 110a with respect to the flow direction of the coolant. In the present exemplary embodiment, the first grooves 121 extend downwardly in the inclined direction with respect to the flow direction of the coolant. Hereinafter, when the first grooves 121 need not be particularly distinguished from each other, these grooves will be appropriately referred to as "first groove 121".

Figure 17:
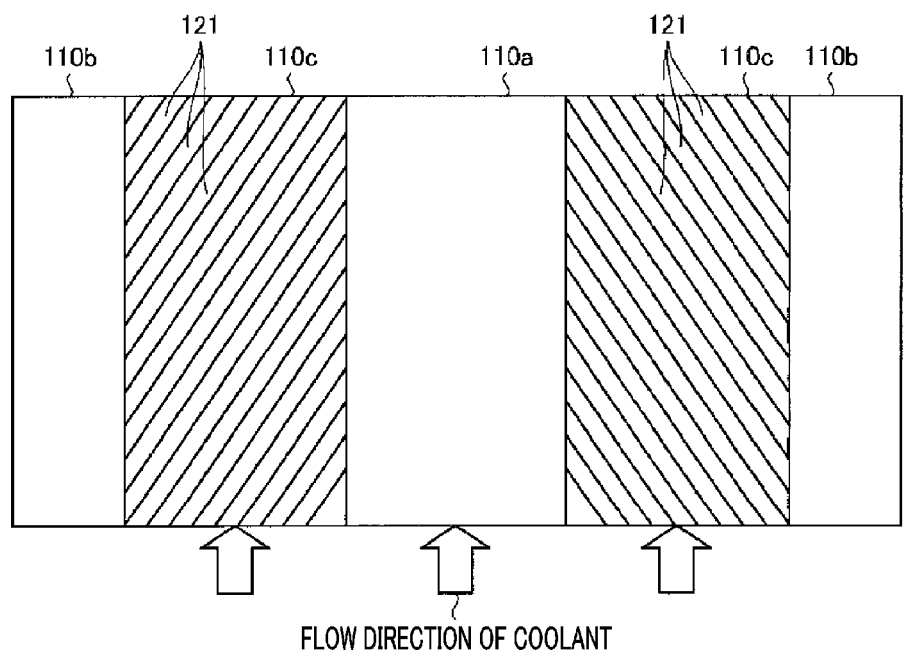
FIG. 17 provides a development view of a coolant path according to the eighth exemplary embodiment.

FIG. 17 presents a development view of the coolant path 110 according to the eighth exemplary embodiment. FIG. 17 shows a state in which the coolant path 110 is cut along a central line of the ceiling surface 110b, and the bottom surface 110a, the ceiling surface 110b and the pair of inner side surfaces 110c are illustrated on the same plane. As depicted in FIG. 17, the coolant path 110 has, at the pair of inner side surfaces 110c, the first grooves 121 extending downwards in the inclined direction with respect to the flow direction (indicated by arrows) of the coolant.

In the plasma processing apparatus 100, while the plasma processing is performed, the heat received by the supporting surface 16a-1 of the supporting member 16a from the plasma tends to increase. In the plasma processing apparatus 100, by allowing the coolant in the liquid phase to flow through the coolant path 110 within the supporting member 16a, the cooling efficiency for the supporting surface 16a-1 as the heat receiving surface which receives the heat from the plasma is expected to be improved.

For the purpose, in the plasma processing apparatus 100, the first grooves 121 extending downwards in the flow direction of the coolant are formed at the pair of inner side surfaces 110c intersecting with the bottom surface 110a within the coolant path 110 through which the coolant in the liquid phase flows.

By forming the first grooves 121 at the pair of inner side surfaces 110c of the coolant path 110, the coolant is transported from the ceiling surface 110b to the bottom surface 110a. Accordingly, a flow velocity of the coolant near the bottom surface 110a gets higher than a flow velocity of the coolant near the ceiling surface 110b. Here, it is known that the heat transfer rate (heat transfer coefficient) of the coolant is in proportion to the flow velocity of the coolant. That is, as the coolant is transported from the ceiling surface 110b to the bottom surface 110a disposed near the supporting surface 16a-1 through the first grooves 121, the flow velocity of the coolant near the bottom surface 110a is increased, and the heat transfer rate of the coolant near the bottom surface 110a is improved. As a result, the cooling efficiency for the supporting surface 16a-1 as the heat receiving surface can be bettered.

The plasma processing apparatus 100 according to the present exemplary embodiment described above includes the supporting member 16a and the coolant path 110. The supporting member 16a has the supporting surface 16a-1 as the heat receiving surface which receives the heat from the plasma. The coolant path 110 is formed within the supporting member 16a along the supporting surface 16a-1, and the coolant in the liquid phase is flown in the coolant path 110. The coolant path 110 has, at the pair of inner side surfaces 110c intersecting with the bottom surface 110a disposed near the supporting surface 16a-1, the first grooves 121 extending in the inclined direction toward the bottom surface 110a with respect to the flow direction of the coolant. Accordingly, in the plasma processing apparatus 100, the cooling efficiency for the supporting surface 16a-1 as the heat receiving surface can be improved even in case that the coolant in the liquid phase is flown in the coolant path 110 within the supporting member 16a.

So far, the various exemplary embodiments have been described. Here, it should be noted that the above-described exemplary embodiments are not limiting, and various changes and modifications may be made.

By way of example, the cross sectional shape of the coolant path 2d according to each exemplary embodiment when viewed from the flow direction of the coolant is not limited to the rectangular shape. The cross section of the coolant path 2d when viewed from the flow direction of the coolant may have a circular shape, an oval shape or a polygonal shape (except the rectangular shape).

Further, the cross sectional shape of the coolant path 110 according to the eighth exemplary embodiment when viewed from the flow direction of the coolant is not limited to the rectangular shape. The cross section of the coolant path 110 when viewed from the flow direction of the coolant may have a circular shape, an oval shape or a polygonal shape (except the rectangular shape).

Figure 13:
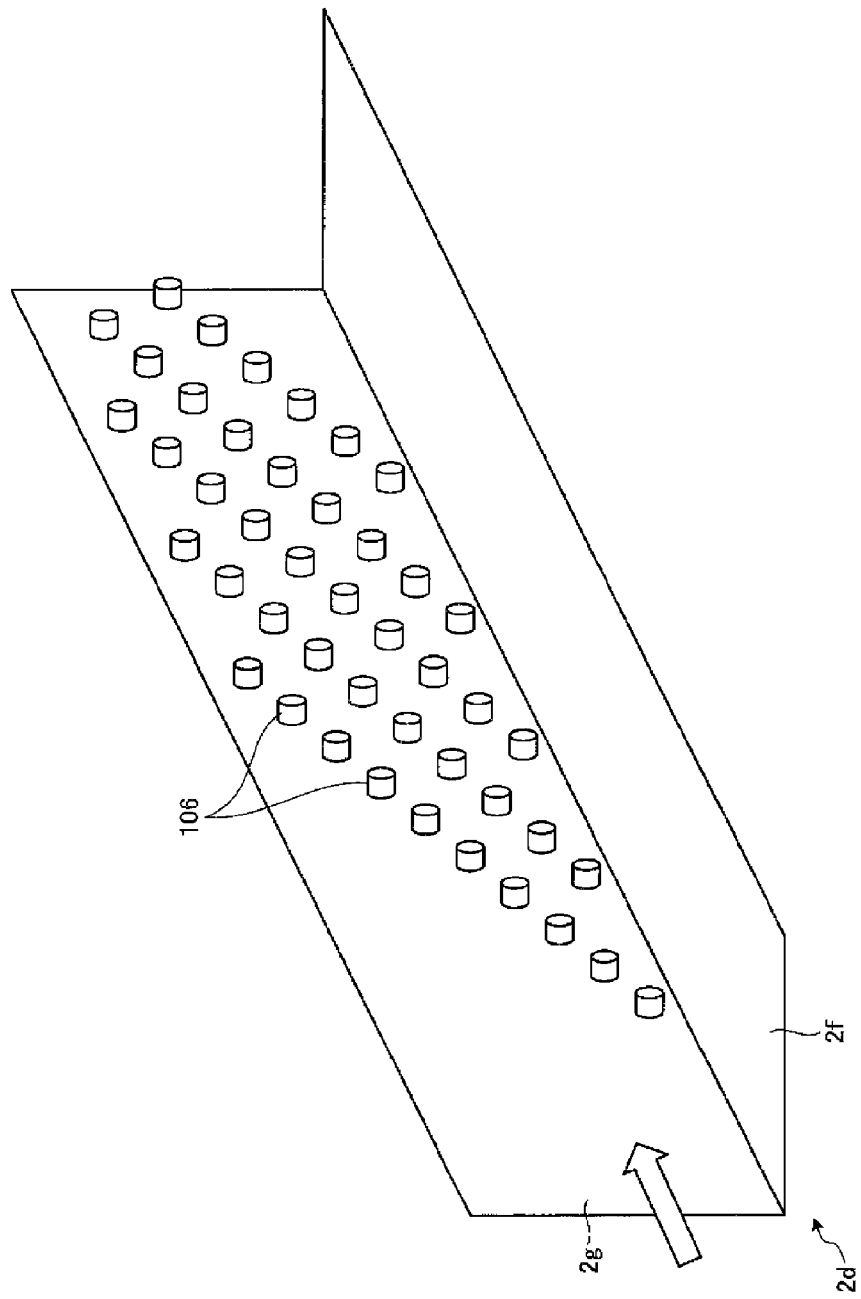
FIG. 13 is a perspective view schematically illustrating an inside of a coolant path according to another exemplary embodiment.
Figure 14:
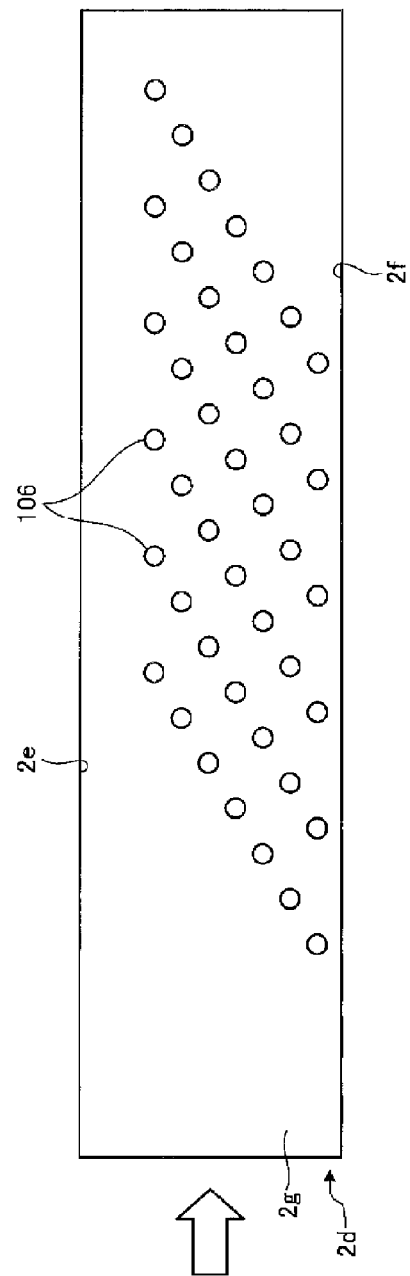
FIG. 14 is a side view schematically illustrating the inside of the coolant path according to the another exemplary embodiment.

Furthermore, the first exemplary embodiment to the seventh exemplary embodiment have been described for the case where the coolant or the liquid film of the coolant is transported from the bottom surface 2f to the ceiling surface 2e by the first grooves 101 (and the second grooves 102). However, the structure for transporting the coolant or the liquid film of the coolant to the ceiling surface 2e is not limited thereto. As depicted in FIG. 13 and FIG. 14, the coolant path 2d may have, at the pair of inner side surfaces 2g intersecting with the ceiling surface 2e disposed near the placing surface 16e, a plurality of protrusions 106 which are arranged in a dot shape upwardly in the inclined direction with respect to the flow direction of the coolant (indicated by an arrow). That is, the coolant path 2d may have, at the pair of inner side surfaces 2g, the plurality of protrusions 106 which are arranged in the dot shape in the inclined direction toward the ceiling surface 2e with respect to the flow direction of the coolant. With this configuration, the same as in case of providing the first grooves 101 (and the second grooves 102), the coolant or the liquid film of the coolant can be moved from the bottom surface 2f to the ceiling surface 2e. FIG. 13 is a perspective view schematically illustrating an inside of the coolant path 2d according to another exemplary embodiment, and FIG. 14 is a side view schematically illustrating the inside of the coolant path 2d according to this another exemplary embodiment.

Further, though the above eighth exemplary embodiment has been described for the case where the coolant is transported from the ceiling surface 110b to the bottom surface 110a by the first grooves 121, the structure for transporting the coolant to the bottom surface 110a is not limited thereto. For example, the coolant path 110 may have, at the pair of inner side surfaces 110c intersecting with the bottom surface 110a disposed near the supporting surface 16a-1, a plurality of protrusions which are arranged in a dot shape downwardly in the inclined direction with respect to the flow direction of the coolant. With this configuration, the same as in case of providing the first grooves 121, the coolant can be moved from the ceiling surface 110b to the bottom surface 110a.

Moreover, in the above, the configurations and the effects of the individual exemplary embodiments have been described. However, the plasma processing apparatus 100 according to each exemplary embodiments may have constituent components of other exemplary embodiments as well. Further, two or more than two combinations of the exemplary embodiments may be made. By way of example, in the plasma processing apparatus 100 according to the first exemplary embodiment, the coolant path 2d may have the first grooves 101 at the pair of inner side surfaces 2g and the second grooves 102 at the bottom surface 2f. Further, in the plasma processing apparatus 100 according to the eighth exemplary embodiment, for example, the coolant in the gas-liquid two-phase state may be flown in the coolant path 110 of the supporting member 16a. Furthermore, in the plasma processing apparatus 100 according to the eighth exemplary embodiment, the coolant path 110 may have the first grooves 121 at the pair of inner side surfaces 110c and second grooves corresponding to the second grooves 102 at the ceiling surface 110b.

In addition, the above various exemplary embodiments have been described for the case where the heat receiving member is the placing table 2 or the supporting member 16a, and the heat receiving surface is the placing surface 6e of the placing table 2 or the supporting surface 16a-1 of the supporting member 16a. However, the heat receiving member and the heat receiving surface are not limited thereto. By way of example, the heat receiving member may be the sidewall of the processing vessel 1 having the inner side surface contacted with the plasma, and the heat receiving surface may be this inner side surface of the sidewall of the processing vessel 1. In case that the heat receiving member is the sidewall of the processing vessel 1, the coolant path may be formed within the sidewall along the inner side surface thereof. Further, the coolant path formed within the sidewall of the processing vessel 1 may have, at a pair of inner wall surfaces intersecting with a first inner wall surface disposed near the heat receiving surface, first grooves extending in an inclined direction toward the first inner wall surface with respect to a flow direction of a coolant.

Moreover, in the above-described various exemplary embodiments, the heat source is the plasma. However, the heat source is not limited thereto. By way of example, if a heater is disposed between the heat receiving surface of the heat receiving member (for example, the placing table 2, or the supporting member 16a) and the coolant path (for example, the coolant path 2d or the coolant path 110), this heater may serve as the heat source.

In addition, the above various exemplary embodiments have been described for the case where the coolant is in the gas-liquid two-phase state or in the liquid phase state. However, the state of the coolant is not limited thereto. A coolant in a gas phase state may be used.

According to the exemplary embodiments, it is possible to improve the uniformity of the temperature distribution in the placing surface of the placing table.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A vacuum processing apparatus, comprising:
a heat receiving member having a heat receiving surface configured to receive heat from a heat source; and
a coolant path formed within the heat receiving member along the heat receiving surface and configured to allow a coolant to flow therein,
wherein the coolant path has, at a pair of second inner wall surfaces intersecting with a first inner wall surface disposed near the heat receiving surface, a first groove extending in an inclined direction toward the first inner wall surface with respect to a flow direction of the coolant.

2. The vacuum processing apparatus of claim 1,
wherein the first groove extends toward the first inner wall surface of the coolant path to have a length not to reach the first inner wall surface, and a gap having a preset width is formed between the first groove and the first inner wall surface.

3. The vacuum processing apparatus of claim 1,
wherein the first groove is formed between multiple protrusions provided at each of the second inner wall surfaces.

4. The vacuum processing apparatus of claim 1,
wherein the coolant path has, at a third inner wall surface facing the first inner wall surface, a second groove extending from a central line along the flow direction of the coolant to the second inner wall surfaces with the central line therebetween, and
the second groove is connected to the first groove.

5. The vacuum processing apparatus of claim 4,
wherein the second groove is formed between multiple protrusions provided at the third inner wall surface.

6. The vacuum processing apparatus of claim 1,
wherein the first groove includes multiple first grooves, and the coolant path has the multiple first grooves at the second inner wall surfaces, and
an inclination angle of each of the multiple first grooves with respect to the flow direction of the coolant is equal to or larger than the inclination angle of the first groove located upstream of the corresponding each of the multiple first grooves in the flow direction of the coolant.

7. The vacuum processing apparatus of claim 1,
wherein the first groove includes multiple first grooves, and the coolant path has the multiple first grooves at the second inner wall surfaces, and
a depth of each of the multiple first grooves is equal to or smaller than the depth of the first groove located upstream of the corresponding each of the multiple first grooves in the flow direction of the coolant.

8. The vacuum processing apparatus of claim 1,
wherein the first groove includes multiple first grooves, and the coolant path has the multiple first grooves at the second inner wall surfaces, and
a depth of each of the multiple first grooves is equal to or larger than the depth of the first groove farther from the first inner wall surface than the corresponding each of the multiple first grooves is.

9. The vacuum processing apparatus of claim 1,
wherein at least one of surface tension, wetting property or hydrophilic property of the first inner wall surface of the coolant path with respect to a liquid film of the coolant is larger than that of the pair of second inner wall surfaces.

10. The vacuum processing apparatus of claim 1,
wherein the coolant path has irregularities, a porous layer or multiple protrusions on the first inner wall surface.

11. The vacuum processing apparatus of claim 1,
wherein, when viewed from the flow direction of the coolant, a cross section of the coolant path has a circular shape, an oval shape or a polygonal shape.

12. A vacuum processing apparatus, comprising:
a heat receiving member having a heat receiving surface configured to receive heat from a heat source; and
a coolant path formed within the heat receiving member along the heat receiving surface, and configured to allow a coolant to flow therein,
wherein the coolant path has, at a pair of second inner wall surfaces intersecting with a first inner wall surface disposed near the heat receiving surface, multiple protrusions arranged in a dot shape in an inclined direction toward the first inner wall surface with respect to a flow direction of the coolant.

13. The vacuum processing apparatus of claim 1, wherein the heat receiving member is a placing table having a placing surface on which a processing target object as a plasma processing target is placed, and
the heat receiving surface is the placing surface of the placing table.

14. The vacuum processing apparatus of claim 1, wherein the heat receiving member is a supporting member having a supporting surface on which a ceiling plate contacted with plasma is supported, and
the heat receiving surface is the supporting surface of the supporting member.

15. The vacuum processing apparatus of claim 1, wherein the heat receiving member is a sidewall of a processing vessel having an inner side surface contacted with plasma, and
the heat receiving surface is the inner side surface of the sidewall of the processing vessel.

16. The vacuum processing apparatus of claim 1, wherein the heat source is plasma.

17. The vacuum processing apparatus of claim 1, wherein the heat source is a heater disposed between the heat receiving surface of the heat receiving member and the coolant path.

18. The vacuum processing apparatus of claim 1, wherein the coolant is a coolant in a gas-liquid two-phase state, a coolant in a liquid phase state, or a coolant in a gas phase state.

* * * * *